United States Patent
Kim et al.

(10) Patent No.: US 10,996,506 B2
(45) Date of Patent: May 4, 2021

(54) POLYHEDRON TYPE DISPLAY DEVICE

(71) Applicant: LG Display Co., Ltd., Seoul (KR)

(72) Inventors: Sun-Woong Kim, Paju-si (KR); Dong-Seok Lee, Paju-si (KR); Su-Jin Chang, Paju-si (KR); Yeong-Eun Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 66 days.

(21) Appl. No.: 16/203,355

(22) Filed: Nov. 28, 2018

(65) Prior Publication Data
US 2019/0171062 A1    Jun. 6, 2019

(30) Foreign Application Priority Data
Dec. 1, 2017  (KR) .................. 10-2017-0164450

(51) Int. Cl.
*G02F 1/1335* (2006.01)
*G02F 1/1333* (2006.01)
(Continued)

(52) U.S. Cl.
CPC ..... *G02F 1/133524* (2013.01); *G02B 6/0035* (2013.01); *G02F 1/133308* (2013.01);
(Continued)

(58) Field of Classification Search
CPC .......... G09F 9/3023; G09F 9/35; G09F 19/00; A42B 1/248; A47G 1/065; H05K 1/14; H05K 2201/10106
See application file for complete search history.

(56) References Cited

U.S. PATENT DOCUMENTS 5,151,802 A * 9/1992 Couturier ............... G09B 9/308
349/1
6,704,079 B2    3/2004 Minoura
(Continued)

FOREIGN PATENT DOCUMENTS

CN        2197714 Y         5/1995
CN     201259587 Y  *     6/2009
(Continued)

OTHER PUBLICATIONS

Kuanhe, English Translation for CN-201259587-Y (Year: 2009).*
(Continued)

*Primary Examiner* — Michael H Caley
*Assistant Examiner* — Jonathan Y Jung
(74) *Attorney, Agent, or Firm* — Fenwick & West LLP

(57) ABSTRACT

A polyhedron type display device includes: a plurality of liquid crystal panels connected to each other to constitute a polyhedral shape; a light source housing at a center of mass of the polyhedral shape; a light source unit accommodated in the light source housing, the light source unit emitting a light to supply the light to the plurality of liquid crystal panels; a light source supporting pillar connecting and supporting the light source housing and the plurality of liquid crystal panels; a structure supporting pedestal supporting the light source supporting pillar; a supporting panel supporting the plurality of liquid crystal panels; a radiating pillar connected to the light source unit and emitting a heat of the light source unit; and a protecting cover covering and protecting the radiating pillar.

21 Claims, 10 Drawing Sheets

(51) Int. Cl.
    *H05K 1/18*     (2006.01)
    *G09F 9/35*     (2006.01)
    *G09F 19/00*     (2006.01)
    *A47G 1/06*     (2006.01)
    *F21V 8/00*     (2006.01)
    *H05K 1/14*     (2006.01)
    *G09G 3/36*     (2006.01)

(52) U.S. Cl.
    CPC ......... *G02F 1/133528* (2013.01); *H05K 1/14* (2013.01); *A47G 1/065* (2013.01); *G02F 2201/56* (2013.01); *G09F 9/35* (2013.01); *G09F 19/00* (2013.01); *G09G 3/36* (2013.01); *H05K 1/181* (2013.01); *H05K 2201/10106* (2013.01); *H05K 2201/10113* (2013.01)

(56) References Cited

U.S. PATENT DOCUMENTS

| | | | |
|---|---|---|---|
| 7,755,715 B2 | 7/2010 | Kimura et al. | |
| 8,564,741 B2 | 10/2013 | Kimura et al. | |
| 9,897,840 B2 | 2/2018 | Fan | |
| 2002/0149721 A1 | 10/2002 | Minoura et al. | |
| 2007/0147045 A1* | 6/2007 | Kimura | G02F 1/133603 362/294 |
| 2008/0049447 A1* | 2/2008 | Jung | G02B 6/006 362/612 |
| 2010/0277671 A1 | 11/2010 | Kimura et al. | |
| 2012/0155083 A1* | 6/2012 | Sato | G02F 1/13336 362/241 |
| 2015/0131022 A1* | 5/2015 | Zhang | G09F 11/00 349/58 |
| 2017/0192273 A1* | 7/2017 | Fan | G09F 9/35 |
| 2018/0059460 A1* | 3/2018 | Lee | G02F 1/13336 |
| 2018/0267764 A1 | 9/2018 | Fan et al. | |

FOREIGN PATENT DOCUMENTS

| | | |
|---|---|---|
| CN | 101943823 A | 1/2011 |
| CN | 201780728 U | 3/2011 |
| CN | 103176304 A | 6/2013 |
| CN | 103592794 A | 2/2014 |
| CN | 204406926 U | 6/2015 |
| CN | 105044959 A | 11/2015 |
| CN | 205252493 U | 5/2016 |
| CN | 106483700 A | 3/2017 |
| CN | 106782139 A | 5/2017 |
| CN | 206441476 U | 8/2017 |
| JP | 2002-229017 A | 8/2002 |
| KR | 10-2014-0069591 A | 6/2014 |

OTHER PUBLICATIONS

China National Intellectual Property Administration, First Office Action, CN Patent Application No. 201811455035.9, dated Nov. 4, 2020, 19 pages.

* cited by examiner

10

20

110

110

120

530

630

POLYHEDRON TYPE DISPLAY DEVICE

CROSS-REFERENCE TO RELATED APPLICATIONS

This patent application claims priority to Republic of Korea Patent Application No. 10-2017-0164450, filed on Dec. 1, 2017, in the Korean Intellectual Property Office, which is incorporated herein by reference in its entirety.

BACKGROUND

Technical Field

The present disclosure relates to a polyhedron type display device, and more particularly, to a polyhedron type display device including a plurality of liquid crystal panels and a single light source unit.

Discussion of the Related Art

A liquid crystal display (LCD) device includes a liquid crystal panel displaying an image and a light source unit supplying a light to the liquid crystal panel.

In general, the LCD device has a rectangular shape. Recently, a polyhedron type display device which displays a three dimensional image using a variant LCD device having a polygonal shape other than a rectangular shape has been suggested.

The polyhedron type display device displays various images using a polyhedron shape formed by connection of a plurality of variant LCD devices.

FIG. 1 is a perspective view showing a polyhedron type display device according to the related art, and FIG. 2 is a cross-sectional view showing a liquid crystal display device of a polyhedron type display device according to the related art.

In FIGS. 1 and 2, a polyhedron type display device 10 according to the related art includes a plurality of liquid crystal display (LCD) devices 20, a supporting pillar 40 and a fixing pedestal 60.

Each of the plurality of LCD devices 20 includes a liquid crystal panel having a triangular shape, a light source unit 60 supplying a light to the liquid crystal panel, first frame 62, second frame 64, and third frame 66 modularizing the liquid crystal panel and the light source unit 60. The liquid crystal panel includes first substrate 50 and second substrate 52 facing and spaced apart from each other, a liquid crystal layer 54 between the first substrate 50 and second substrate 52, and first polarizing plate 56 and second polarizing plate 58 on outer surfaces of the first substrate 50 and second substrate 52, respectively.

The light source unit 60 has a direct type or an edge type. The direct type light source unit 60 which directly supplies a light of a light source to the liquid crystal panel includes a light source and an optical sheet between the light source and the liquid crystal panel. The edge type light source unit 60 which indirectly supplies a light of a light source to the liquid crystal panel includes a light guide plate, a light source at a side of the light guide plate and an optical sheet between the light guide plate and the liquid crystal panel.

The polyhedron type display device 10 according to the related art constitutes a three dimensional display surface of a polyhedral shape close to a spherical shape by connecting the plurality of LCD devices 20 and displays an image using the three dimensional display surface.

Since each of the plurality of LCD devices 20 includes the liquid crystal panel and the light source unit 60, the liquid crystal panels of the two adjacent LCD devices 20 are separated from each other by a gap distance for disposing the respective light source units 60. However, the gap distance may obstruct an image displayed by the polyhedron type display device 10.

In addition, since each of the plurality of LCD devices 20 includes the liquid crystal panel and the light source unit 60, a power consumption and a weight of the polyhedron type display device 10 increase. When the number of the light sources of the light source unit 60 decreases to reduce the power consumption, the light sources may be watched and a luminance may be reduced.

SUMMARY

Embodiments relate to a polyhedron type display device where a gap distance between adjacent liquid crystal panels is minimized and a power consumption and a weight are reduced by a three dimensional display surface of a plurality of liquid crystal panels and a single light source unit in the three dimensional display surface supplying light to the plurality of liquid crystal panels.

One or more embodiments relate to a polyhedron type display device where assembly of parts is minimized and a uniform light is stably supplied to a plurality of liquid crystal panels by supporting and fixing a light source using a light source housing, a light source supporting pillar, and a structure supporting pedestal and by supporting and fixing a support panel using the structure supporting pedestal, and a supporting shoulder.

Advantages and features of the disclosure will be set forth, in part, in the description, which follows and, in part, will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
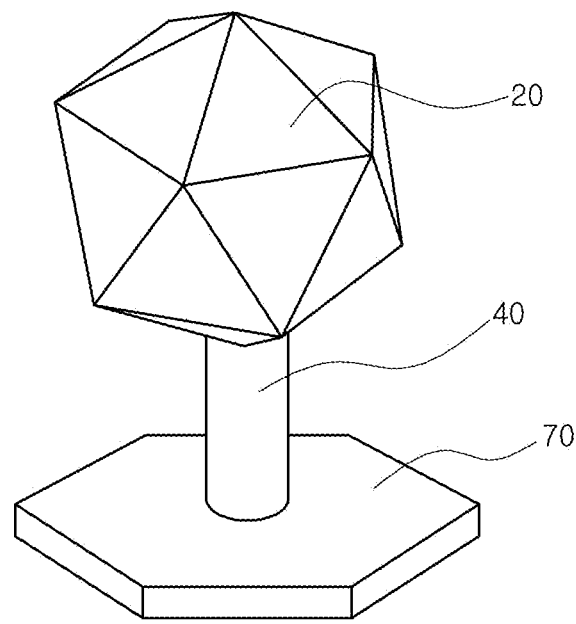
FIG. 1 is a perspective view showing a polyhedron type display device according to the related art.
Figure 2:
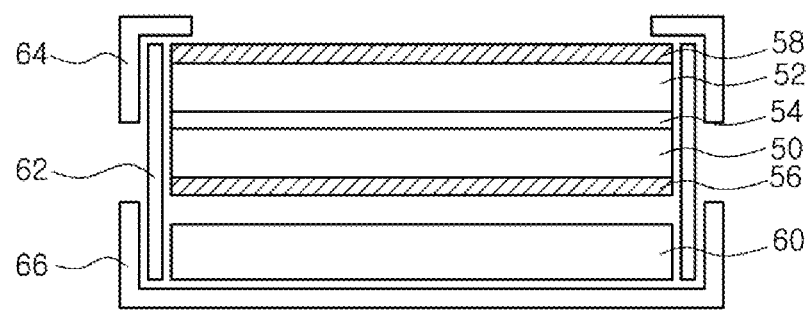
FIG. 2 is a cross-sectional view showing a liquid crystal display device of a polyhedron type display device according to the related art.

Reference will now be made in detail to embodiments of the present disclosure, examples of which are illustrated in the accompanying drawings. In the following description, when a detailed description of well-known functions or configurations related to this document is determined to unnecessarily cloud a general understanding of an embodiment of the disclosure, the detailed description thereof will be omitted. The progression of processing steps and/or operations described is an example; however, the sequence of steps and/or operations is not limited to that set forth herein and may be changed, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 3:
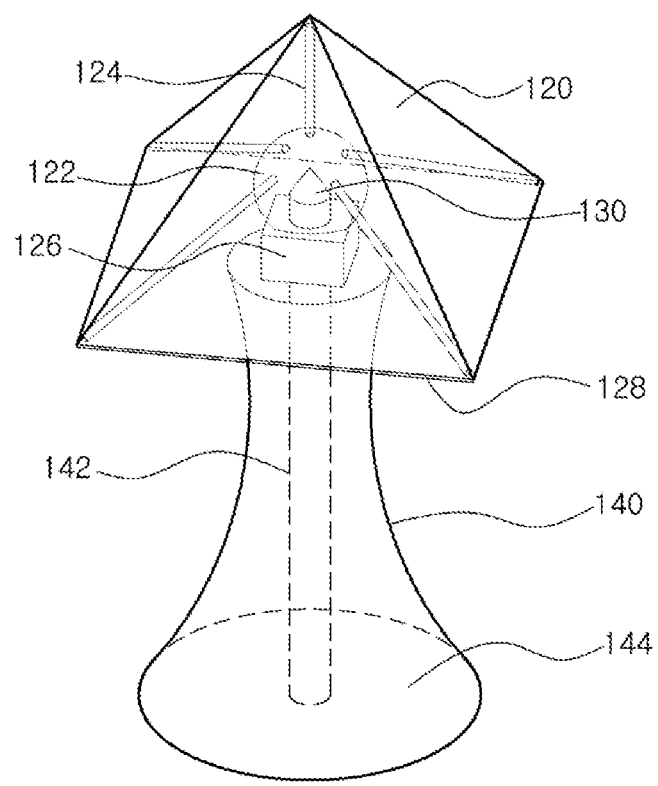
FIG. 3 is a perspective view showing a polyhedron type display device according to a first embodiment of the present disclosure.
Figure 4:
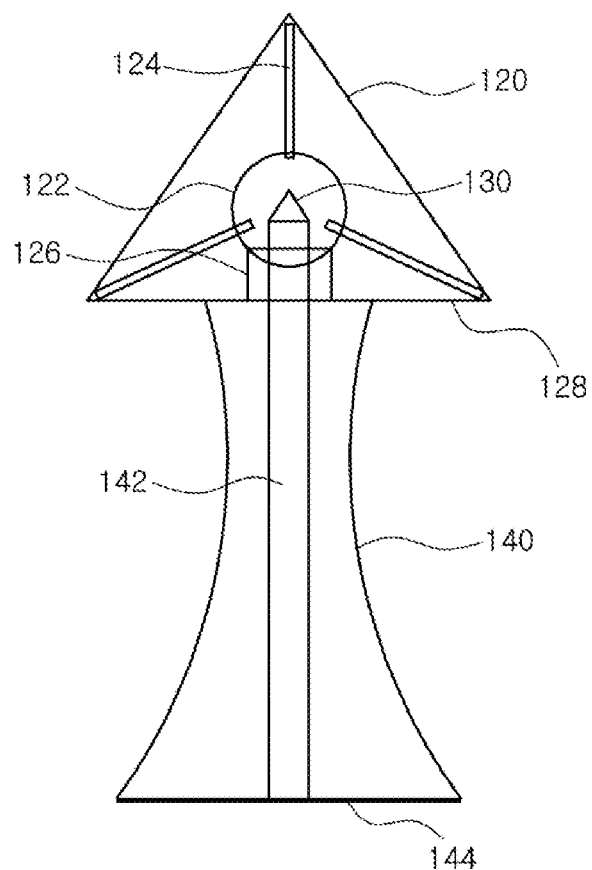
FIG. 4 is a cross-sectional view showing a polyhedron type display device according to a first embodiment of the present disclosure.

FIG. 3 is a perspective view showing a polyhedron type display device according to a first embodiment of the present disclosure, and FIG. 4 is a cross-sectional view showing a polyhedron type display device according to a first embodiment of the present disclosure.

In FIGS. 3 and 4, a polyhedron type display device 110 according to a first embodiment of the present disclosure includes a plurality of liquid crystal panels 120, a light source housing 122, a light source supporting pillar 124, a structure supporting pedestal 126, a supporting panel 128, a single light source unit 130, a protecting cover 140, a radiating pillar 142, and a fixing pedestal 144.

Each of the plurality of liquid crystal panels 120 displays an image using a light of the single light source unit 130, and the plurality of liquid crystal panels 120 constitute a three dimensional display surface of a polyhedral shape.

Although each of the plurality of liquid crystal panels 120 exemplarily has a triangular shape in FIGS. 3 and 4, each of the plurality of liquid crystal panels 120 may have a rectangular shape or a pentagonal shape.

The light source housing 122 may be disposed at a center of mass of the polyhedral shape and may have a hollow shape to accommodate the single light source unit 130. The light source housing 122 may include a plastic which is treated with transparency or haze.

The light source supporting pillar 124 may connect and support the light source housing 122 and the plurality of liquid crystal panels 120 and may include a plastic which is treated with transparency or haze.

The structure supporting pedestal 126 may support the light source housing 122 and the supporting panel 128 and may have a hollow shape to accommodate a conductive line connected to the plurality of liquid crystal panels 120 and the single light source unit 130.

The supporting panel 128 may connect and support the plurality of liquid crystal panels 120 and may be connected and supported by the structure supporting pedestal 126. the supporting panel in conjunction with the plurality of liquid crystal panel forming an enclosed area A power source unit and a circuit unit may be disposed on the supporting panel 128.

The single light source unit 130 may be accommodated in the light source housing 122 and may emit and supply a light to the plurality of liquid crystal panels 120.

The protecting cover 140 may protect the radiating pillar 142 and a circuit and may have a hollow shape to accommodate the conductive line connected to the plurality of liquid crystal panels 120 and the single light source unit 130. The protecting cover 140 may include a stainless steel material.

A circuit such as a timing controller protruding outside the protecting cover 140 may be covered with and protected by a cover shield.

The radiating pillar 142 may penetrate the structure supporting pedestal 126 and the light source housing 122 to connect and support the single light source unit 130. The radiating pillar 142 may include aluminum to radiate heat from the single light source unit 130.

The fixing pedestal 144 may be connected to the radiating pillar 142 and may support and fix the protecting cover 140 and the radiating pillar 142.

In the polyhedron type display device 110 according to the first embodiment of the present disclosure, a three dimensional display surface of a polyhedral shape close to a spherical shape may be constituted by connecting the plurality of liquid crystal panels 120 and various independent images may be displayed by using the three dimensional display surface.

Since the plurality of liquid crystal panels 120 receives a light from the single light source unit 130, the two adjacent liquid crystal panels 120 do not require a gap distance or a gap space for each of light source units. As a result, the two adjacent liquid crystal panels 120 is separated from each other by a smaller gap distance or a gap space as compared with the related art polyhedron type display device.

The gap distance or the gap space among the plurality of liquid crystal panels 120 constituting the three dimensional display surface of a polyhedral shape is minimized and a display quality of an image displayed by the polyhedron type display device 110 is improved.

In addition, since the plurality of liquid crystal panels 120 receive a light from the single light source unit 130, a power consumption and a weight of the polyhedron type display device 110 are reduced.

Figure 5:
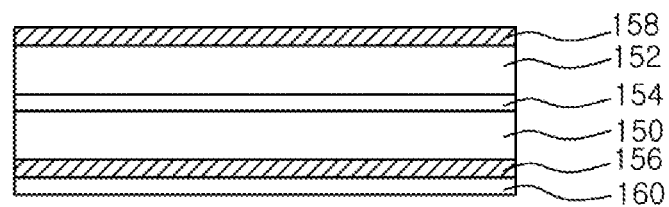
FIG. 5 is a cross-sectional view showing a liquid crystal panel of a polyhedron type display device according to a first embodiment of the present disclosure.

FIG. 5 is a cross-sectional view showing a liquid crystal panel of a polyhedron type display device according to a first embodiment of the present disclosure. Reference is made to FIGS. 3 and 4 with FIG. 5.

In FIG. 5, each of the plurality of liquid crystal panels 120 includes first substrate 150 and second substrate 152, a liquid crystal layer 154, first polarizing plate 156 and second polarizing plate 158 and an optical sheet 160.

The first substrate 150 and second substrate 152 face into and are spaced apart from each other, and the liquid crystal layer 154 is disposed between the first substrate 150 and second substrate 152.

The first polarizing plate 156 and the optical sheet 160 are sequentially disposed on an outer surface of the first substrate 150, and the second polarizing plate 158 is disposed on an outer surface of the second substrate 152.

Although not shown, a gate line, a data line, a thin film transistor (TFT) and a pixel electrode may be disposed on an inner surface of the first substrate 150. The gate line and the data line cross each other to define a pixel region. The TFT may be connected to the gate line and the data line, and the pixel electrode may be connected to the TFT.

A black matrix, a color filter layer and a common electrode may be disposed on an inner surface of the second substrate 152. The black matrix may correspond to the gate line, the data line and the TFT, and the color filter layer may correspond to the pixel region on the black matrix. The common electrode may be disposed on the color filter layer.

A driving circuit unit may be connected to each of the plurality of liquid crystal panels 120. The driving circuit unit may include a timing controller, a gate driver and a data driver. The timing controller may generate an image data, a gate control signal and a data control signal by using an image signal and a timing signal supplied from an external system. The gate driver may generate a gate signal by using the gate control signal and may supply the gate signal to the gate line. The data driver may generate a data signal by using the image data and the data control signal and may supply the data signal to the data line.

As a result, each of the plurality of liquid crystal panels 120 may display an independent image by using the gate signal and the data signal.

The first polarizing plate 156 and second polarizing plate 158 may selectively transmit a predetermined polarization component of a light.

The optical sheet 160 may improve a uniformity of a light supplied from the single light source unit 130 through diffusion and collimation. The optical sheet 160 may include a plurality of diffusing films and a plurality of prism films.

The first polarizing plate 156 and the optical sheet 160 of each of the plurality of liquid crystal panels 120 may be attached to the first substrate 150 through an adhesive such as a resin or a double-sided tape. Alternatively, the first polarizing plate 156 and the optical sheet 160 of each of the plurality of liquid crystal panels 120 may contact and be fixed to the first substrate 150 by a panel connecting unit 121 (of FIGS. 7A to 7C). A total weight of the polyhedron type display device 110 may be reduced by decreasing a weight of the plurality of liquid crystal panels 120 due to omission of a plurality of frames differently from the related art display device.

FIGS. 6A to 6F are a single light source unit of a polyhedron type display device according to first to sixth embodiments, respectively, of the present disclosure. Reference is made to FIGS. 3 and 4 with FIGS. 6A to 6F.

Figure 6A:
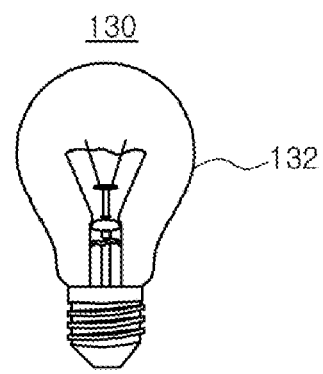
FIGS. 6A to 6F are a single light source unit of a polyhedron type display device according to first to sixth embodiments, respectively, of the present disclosure.

In FIG. 6A, a single light source unit 130 of a polyhedron type display device according to a first embodiment of the present disclosure includes a light source 132 such as a fluorescent lamp, an incandescent lamp and a light emitting diode (LED).

Figure 6B:
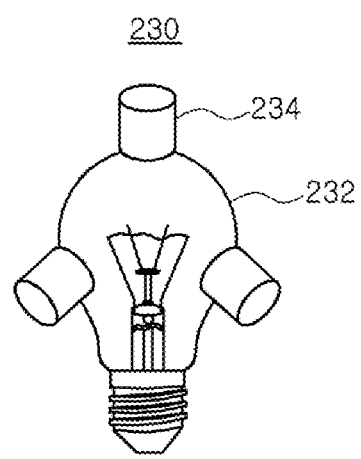

In FIG. 6B, a single light source unit 230 of a polyhedron type display device according to a second embodiment of the present disclosure includes a light source 232 such as a fluorescent lamp, an incandescent lamp and a light emitting diode (LED) and at least one auxiliary light source 234 attached to a surface of the light source 232. The at least one auxiliary light source 234 may be disposed to correspond to a vertex of a three dimensional display surface of a polyhedral shape constituted by a plurality of liquid crystal panels 120 and may complementally supply a light to the vertex portion of the three dimensional display surface of the polyhedral shape where a relatively small amount of light is supplied by the light source 232.

Figure 6C:
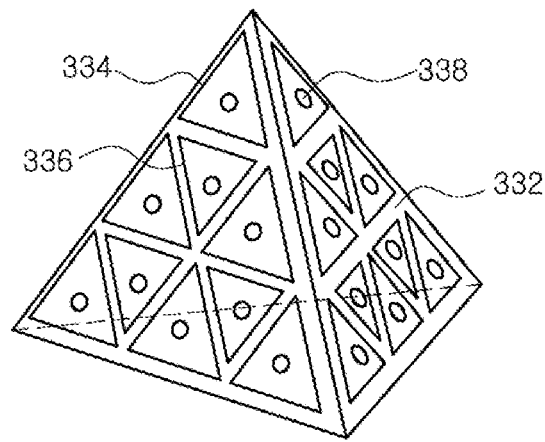

In FIG. 6C, a single light source unit 330 of a polyhedron type display device according to a third embodiment of the present disclosure includes a light source attaching surface 332 corresponding to a three dimensional display surface of a polyhedral shape constituted by a plurality of liquid crystal panels 120, a plurality of first printed circuit boards (PCBs) 334 and a plurality of second light source PCBs 336 attached to the light source attaching surface 332, and light sources 338 such as a fluorescent lamp, an incandescent lamp and a light emitting diode (LED), each of which is mounted on a corresponding one of the plurality of first PCBs 334 and the plurality of second light source PCBs 336.

For example, when the three dimensional display surface of the polyhedral shape constituted by the plurality of liquid crystal panels 120 may have a regular tetrahedron shape, the light source attaching surface 332 may have a regular tetrahedron shape.

The single light source unit 330 including the light source attaching surface 332 of a polyhedral shape may be contained entirely inside the light source housing 122. In addition, the light source unit 330 including the light source attaching surface 332 of a polyhedron shape may be spaced apart from the polyhedral shape constituted by the plurality of liquid crystal panels 120.

The plurality of first PCBs 334 and the plurality of second PCBs 336 constitute the light source attaching surface 332. For example, the plurality of first PCBs 334 may have a triangular shape where a bottom side is disposed at a lower portion and the plurality of second PCBs 336 may have a triangular shape where a bottom side is disposed at an upper portion.

Each of the plurality of first PCBs 334 and the plurality of second PCBs 336 may be connected to a conductive line in the structure supporting pedestal 126 and the radiating pillar 142 to supply a source power to a light source 338.

Figure 6D:
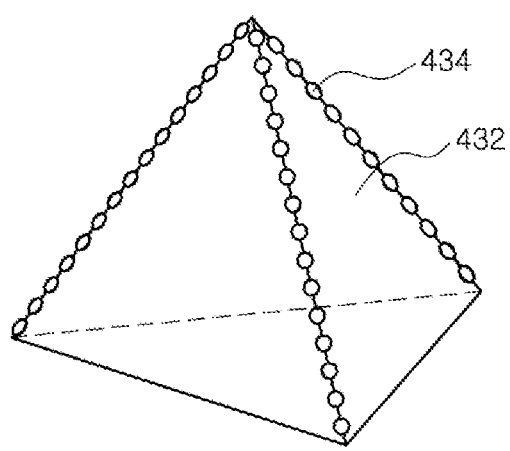

In FIG. 6D, a single light source unit 430 of a polyhedron type display device according to a fourth embodiment of the present disclosure includes a light source attaching surface 432 corresponding to a three dimensional display surface of a polyhedral shape constituted by a plurality of liquid crystal panels 120 and light sources 434 such as a fluorescent lamp, an incandescent lamp and a light emitting diode (LED) mounted on a corner between the adjacent light source attaching surfaces 432.

Since a light source 434 is mounted on the corner between the adjacent light source attaching surfaces 432, a light may be further supplied to the corner portion of the three dimensional display surface having a relatively small amount of light.

Although the light source 434 is exemplarily mounted on the corner between the adjacent light source attaching surfaces 432 in FIG. 6D, the plurality of first PCBs 334 and the plurality of second PCBs 336 having the light source 338 may be attached to the light source attaching surface 432 as in the third embodiment, and the light source 434 may be mounted on the corner between the adjacent light source attaching surface 432 in another embodiment.

Figure 6E:
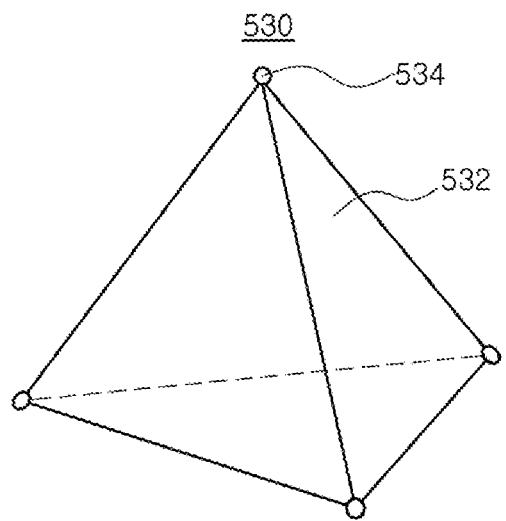

In FIG. 6E, a single light source unit 530 of a polyhedron type display device according to a fifth embodiment of the present disclosure includes a light source attaching surface 532 corresponding to a three dimensional display surface of a polyhedral shape constituted by a plurality of liquid crystal panels 120 and a light source 534 such as a fluorescent lamp, an incandescent lamp and a light emitting diode (LED) mounted on a vertex of the light source attaching surface 532.

Since the light source 534 is mounted on the vertex of the light source attaching surface 532, a light may be further supplied to the vertex portion of the three dimensional display surface having a relatively small amount of light.

Although the light source 534 is exemplarily mounted on the vertex of the light source attaching surface 532 in FIG. 6E, the plurality of first PCBs 334 and the plurality of second PCBs 336 having the light source 338 may be attached to the light source attaching surface 532 as in the third and fourth embodiments, the light source 434 may be mounted on the corner between the adjacent light source attaching surface 432, and the light source 534 may be mounted on the vertex of the light source attaching surface 532 in another embodiment.

Figure 6F:
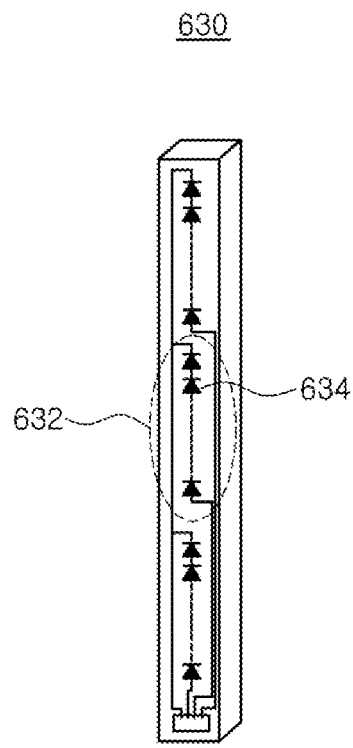

In FIG. 6F, a single light source unit 630 of a polyhedron type display device according to a sixth embodiment of the present disclosure includes a plurality of light source arrays 632 which are disposed in a line to constitute a pillar shape. Each of the plurality of light source arrays 632 may include a plurality of light sources 634 such as a light emitting diode (LED) which are connected to each other in series.

A circuit such as a connector for supplying a source power may be disposed under the plurality of light source arrays 632.

Figure 7A:
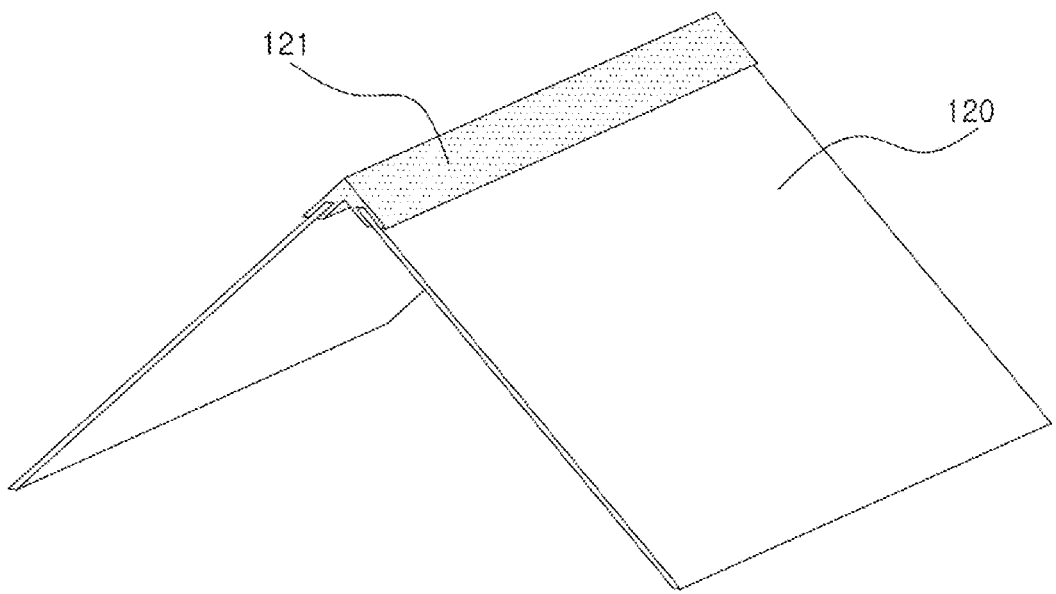
FIGS. 7A, 7B and 7C are perspective views showing a panel connecting unit of a polyhedron type display device according to first, seventh and eighth embodiments, respectively, of the present disclosure.
Figure 7B:
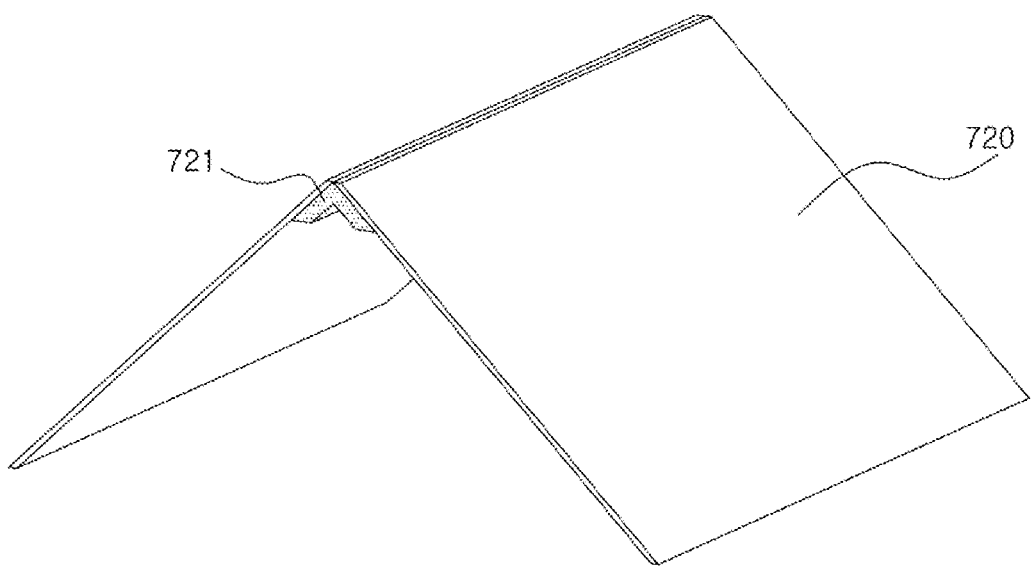
Figure 7C:
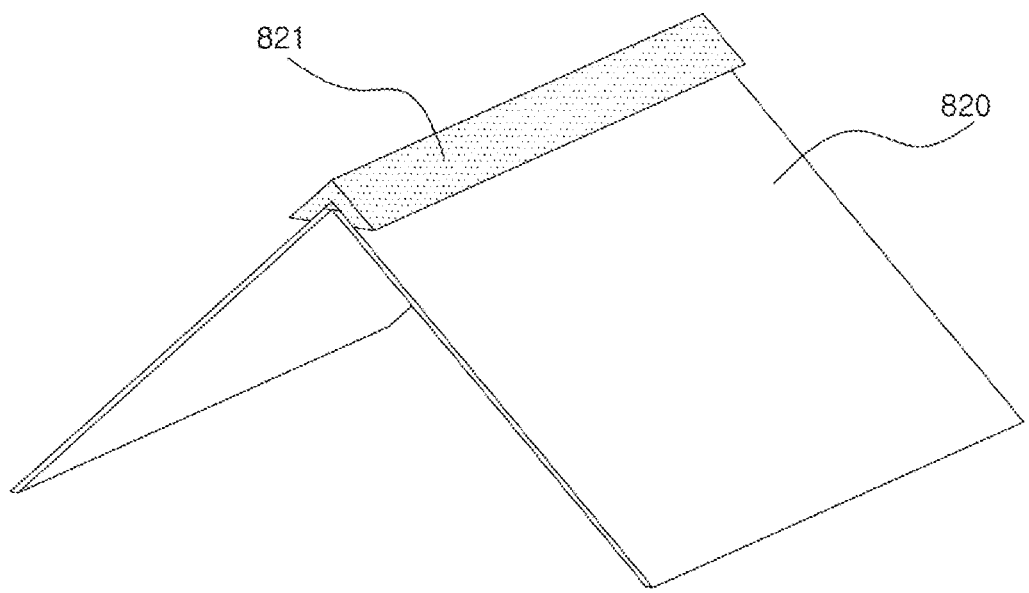

FIGS. 7A, 7B and 7C are perspective views showing a panel connecting unit of a polyhedron type display device according to first, seventh and eighth embodiments, respectively, of the present disclosure. Reference is made to FIGS. 3 and 4 with FIGS. 7A to 7C.

In FIG. 7A, two adjacent liquid crystal panels 120 of a plurality of liquid crystal panels 120 of a polyhedron type display device 110 according to a first embodiment of the present disclosure are connected to each other through a panel connecting unit 121.

The panel connecting unit 121 includes a first supporting plate and a second supporting plate bent with a predetermined angle. Each of the first supporting plate and second supporting plate includes a groove, and the plurality of liquid crystal panels 120 are inserted into and attached to the groove of the first supporting plate and second supporting plate by using an adhesive such as a double-sided tape.

In FIG. 7B, two adjacent liquid crystal panels 720 of a plurality of liquid crystal panels 720 of a polyhedron type display device according to a seventh embodiment of the present disclosure are connected to each other through a panel connecting unit 721.

The panel connecting unit 721 includes a first supporting plate and a second supporting plate forming an angle with the first supporting plate. The plurality of liquid crystal panels 720 are attached to an outer surface of the first supporting plate and second supporting plate by using an adhesive such as a double-sided tape.

In FIG. 7C, two adjacent liquid crystal panels 820 of a plurality of li quid crystal panels 820 of a polyhedron type display device according to an eighth embodiment of the present disclosure are connected to each other through a panel connecting unit 821.

The panel connecting unit 821 includes a first supporting plate and a second supporting plate forming an angle with the first supporting plate each other. The plurality of liquid crystal panels 820 are attached to an inner surface of the first supporting plate and second supporting plate by using an adhesive such as a double-sided tape.

Figure 8:
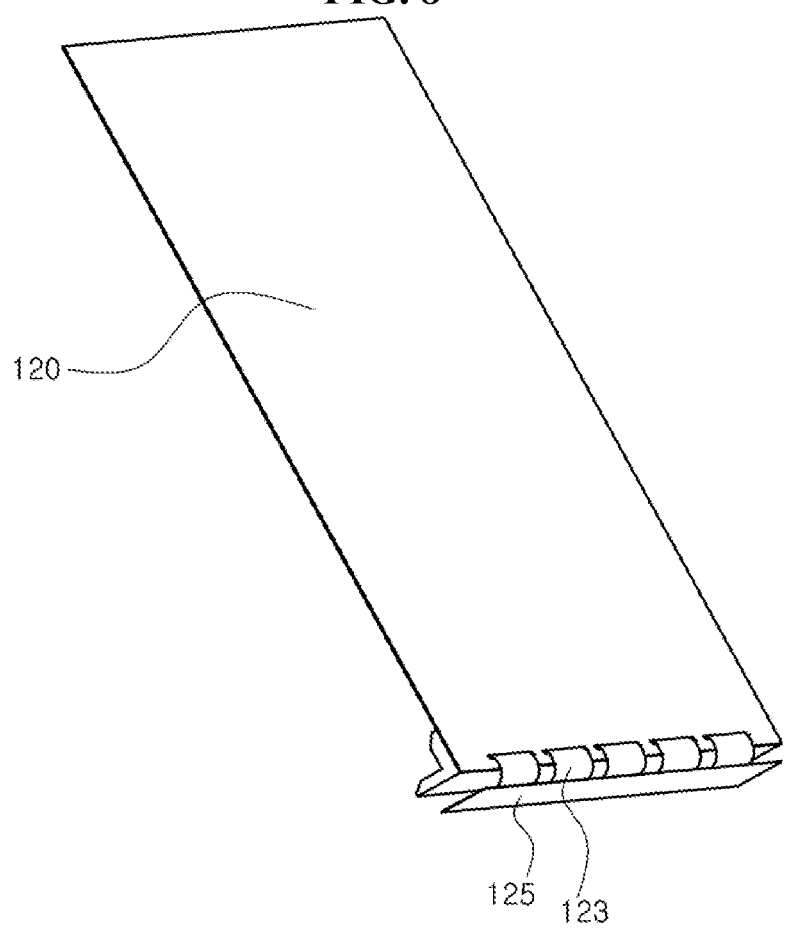
FIG. 8 is a perspective view showing a panel printed circuit board of a polyhedron type display device according to a first embodiment of the present disclosure.

FIG. 8 is a perspective view showing a panel printed circuit board of a polyhedron type display device according to a first embodiment of the present disclosure. Reference is made to FIGS. 3 and 4 with FIG. 8.

In FIG. 8, a plurality of connectors 123 are connected to each of a plurality of liquid crystal panels 120 of a polyhedron type display device 110 according to a first embodiment of the present disclosure, and a panel printed circuit board (PCB) 125 is connected to the plurality of connectors 123.

After the plurality of connectors 123 and the panel PCB 125 are attached to each of the plurality of liquid crystal panels 120, the plurality of connectors 123 are bent, and the panel PCB 125 is disposed on the supporting panel 128.

Figure 9:
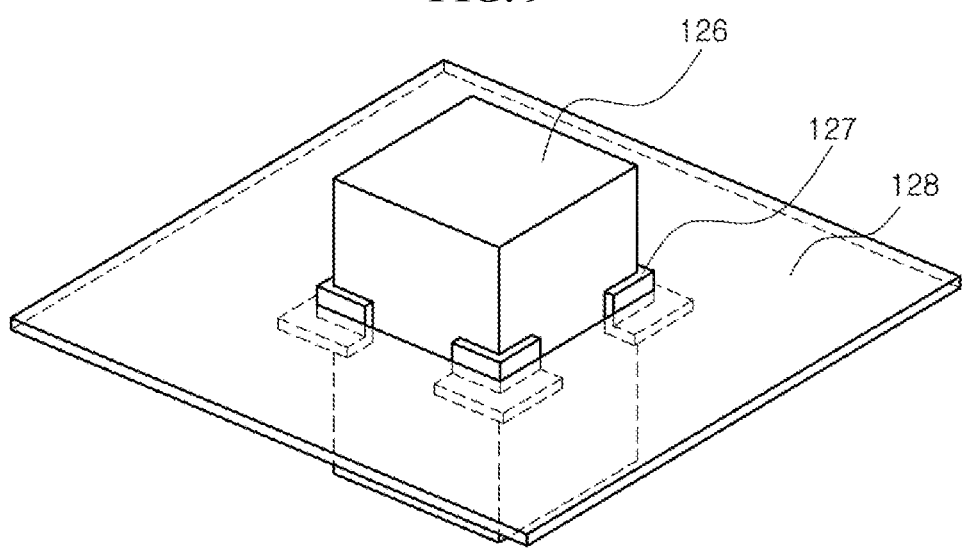
FIG. 9 is a perspective view showing a supporting panel and a structure supporting pedestal of a polyhedron type display device according to a first embodiment of the present disclosure.

A plurality of concave portions each having a U shape corresponding to the plurality of connectors 123 may be disposed at a side of each of the plurality of liquid crystal panels 120. The plurality of connectors 123 may be bent along the plurality of concave portions FIG. 9 is a perspective view showing a supporting panel and a structure supporting pedestal of a polyhedron type display device according to a first embodiment of the present disclosure. Reference is made to FIGS. 3 and 4 with FIG. 9.

In FIG. 9, a supporting shoulder 127 having an L shape is attached to a corner of a structure supporting pedestal 126 of a polyhedron type display device according to a first embodiment of the present disclosure, and a supporting panel 128 is supported by the supporting shoulder 127 of the supporting panel 128.

Figure 10:
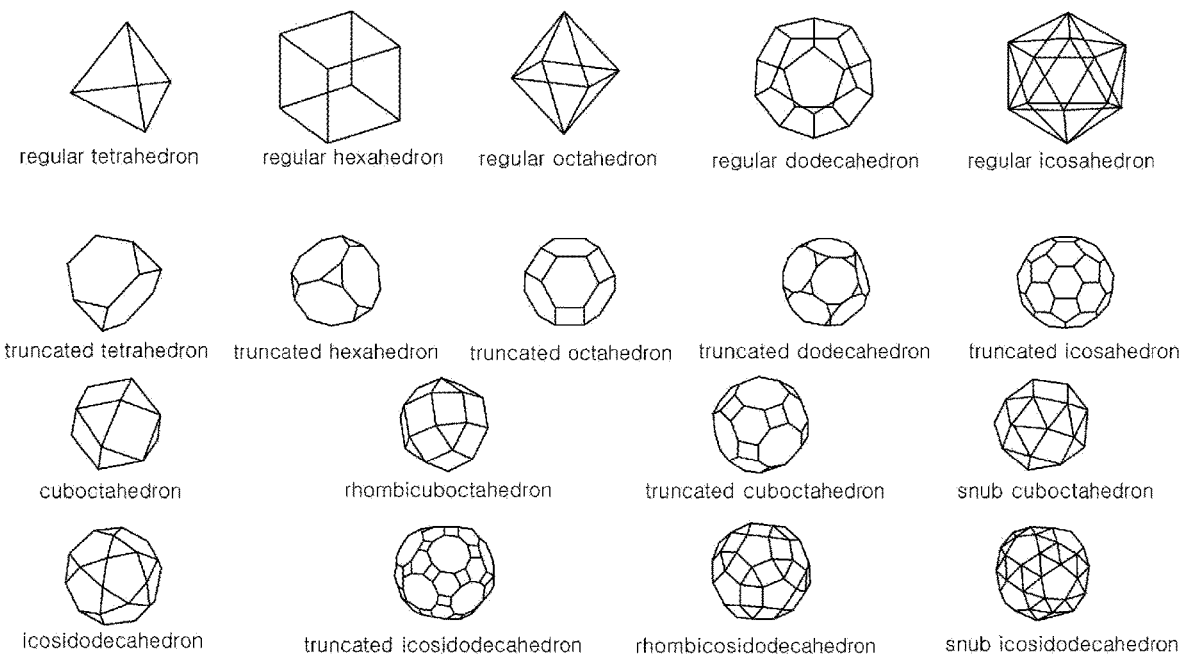
FIG. 10 is a perspective view showing a three dimensional display surface of a polyhedron type display device according to various embodiments of the present disclosure.

FIG. 10 is a perspective view showing a variety of three dimensional display surfaces of a polyhedron type display device according to various embodiments of the present disclosure.

In FIG. 10, a plurality of liquid crystal panels of a polyhedron type display device according to various embodiments of the present disclosure are connected to each other to constitute a three dimensional display surface of a polyhedral shape. The polyhedral shape of the three dimensional display surface may have one of a regular tetrahedron, a regular hexahedron, a regular octahedron, a regular dodecahedron, a regular icosahedron, a truncated tetrahedron, a truncated hexahedron, a truncated octahedron, a truncated dodecahedron, a truncated icosahedron, a cuboctahedron, a rhombicuboctahedron, a truncated cuboctahedron, a snub cuboctahedron, a icosidodecahedron, a truncated icosidodecahedron, a rhombicosidodecahedron, and a snub icosidodecahedron.

Consequently, in the polyhedron type display device 110 according to the present disclosure, the plurality of liquid crystal panels 120 are connected to each other to constitute the three dimensional display surface, and the single light source unit 130 is disposed in the three dimensional display surface to supply the light to the plurality of liquid crystal panels. As a result, a gap distance or a gap space between the adjacent liquid crystal panels 120 is minimized, and the power consumption and the weight of the polyhedron type display device 110 are reduced.

In addition, the single light source unit 130 is supported and fixed by using the light source housing 122, the light source supporting pillar 124, and the structure supporting pedestal 126 and the supporting panel 128 is supported and fixed by using the structure supporting pedestal 126 and the supporting shoulder 127. As a result, assembly of parts are minimized, and uniform light is stably supplied to the plurality of liquid crystal panels 120 to improve the display quality of the image.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A polyhedron display device, comprising:
    a plurality of liquid crystal panels connected to each other to constitute a polyhedral shape;
    a light source housing at a center of mass of the polyhedral shape;
    a light source unit accommodated in the light source housing at the center of mass of the polyhedral shape;
    a light source supporting pillar connecting and supporting the light source housing and the plurality of liquid crystal panels; and
    a structure supporting pedestal supporting the light source supporting pillar,
    wherein the polyhedral shape includes a plurality of vertices, and
    wherein the light source supporting pillar has a first end and a second end at both portions of a longitudinal direction, thereby the plurality of vertices and a surface of the light source housing are spaced apart by a length of the light source supporting pillar.

2. The polyhedron display device of claim 1, wherein each of the plurality of liquid crystal panels comprises:
    a first substrate facing into and spaced apart from a second substrate;
    a liquid crystal layer between the first substrate and the second substrate;
    a first polarizing plate and an optical sheet sequentially on an outer surface of the first substrate; and
    a second polarizing plate on an outer surface of the second substrate.

3. The polyhedron display device of claim 1, wherein the light source unit comprises:
    a light source; and
    at least one auxiliary light source attached to a surface of the light source and corresponding to a vertex of the polyhedral shape.

4. The polyhedron display device of claim 1, wherein the light source unit comprises:
    a light source attaching surface corresponding to the polyhedral shape;
    a plurality of first printed circuit boards and a plurality of second printed circuit boards attached to the light source attaching surface; and
    a light source mounted on each of the plurality of first printed circuit boards and the plurality of second printed circuit boards.

5. The polyhedron display device of claim 1, wherein the light source unit comprises:
    a light source attaching surface corresponding to the polyhedral shape; and
    a light source mounted at one of a corner between the light source attaching surfaces and a vertex of the light source attaching surface.

6. The polyhedron display device of claim 1, wherein the light source unit includes a plurality of light source arrays disposed in a line to form a pillar shape, and wherein each of the plurality of light source arrays includes a plurality of light sources connected to each other in series.

7. The polyhedron display device of claim 1, wherein at least two adjacent liquid crystal panels of the plurality of liquid crystal panels are connected to each other through a panel connecting unit including a first supporting plate and a second supporting plate forming an angle with the first supporting plate.

8. The polyhedron display device of claim 7, wherein the plurality of liquid crystal panels are attached to:
    a groove of the first supporting plate,
    a groove of the second supporting plate,
    an outer surface of the first supporting plate,
    an outer surface of the second supporting plate,
    an inner surface of the first supporting plate, or
    an inner surface of the second supporting plate.

9. The polyhedron display device of claim 1, further comprising:
    a supporting panel supporting the plurality of liquid crystal panels;
    a radiating pillar connected to the light source unit and emitting a heat of the light source unit; and
    a protecting cover covering and protecting the radiating pillar.

10. The polyhedron display device of claim 9, wherein a supporting shoulder is attached to a corner of the structure supporting pedestal, and wherein the supporting panel is supported by the supporting shoulder.

11. A polyhedron display device comprising:
    a plurality of liquid crystal panels connected together to form a polyhedral shape, the polyhedral shape including a plurality of vertices;
    one or more light sources within the polyhedral shape and spaced apart from the plurality of liquid crystal panels, each of the one or more light sources configured to emit light into and through at least two of the liquid crystal panels simultaneously;
    a light source housing covering the one or more light sources and disposed within the polyhedral shape; and
    a plurality of pillars between the light source housing and the plurality of liquid crystal panels, each of the plurality of pillars having a first end and a second end at both end portions of a longitudinal direction, each of the plurality of pillars including a first end disposed at a corresponding one of the plurality of vertices and a second end disposed on a surface of the light source housing, thereby the plurality of vertices and the surface of the light source housing are spaced apart by a length of the plurality of pillars.

12. The polyhedron display device of claim 11, wherein each of the plurality of liquid crystal panels comprises:
    a first substrate,
    a second substrate disposed on the first substrate and spaced apart from the first substrate,
    a first polarizing plate disposed on the first substrate,
    an optical sheet disposed on the first polarizing plate, and
    a second polarizing plate disposed on the second substrate.

13. The polyhedron display device of claim 11, wherein the one or more light sources comprise a primary light source and at least one auxiliary light source corresponding to a vertex of the plurality of vertices of the polyhedral shape and attached to a surface of the primary light source.

14. The polyhedron display device of claim 11, wherein each of the one or more light sources comprises:

a light source attaching surface corresponding to the polyhedral shape, a plurality of printed circuit boards disposed on the light source attaching surface, and a plurality of light sources, each light source mounted on a corresponding printed circuit board of the plurality of circuit boards.

15. The polyhedron display device of claim 11, wherein the one or more light source comprises:
    a light source attaching surface corresponding to the polyhedral shape, and
    a plurality of component light sources, each component light source mounted on a vertex of the light source attaching surface.

16. The polyhedron display device of claim 11, wherein the light source comprises:
    a light source attaching surface corresponding to the polyhedral shape, and
    a plurality of component light sources, each component light source mounted on an edge where two faces of the light source attaching surface meet.

17. The polyhedron display device of claim 11, wherein the light source comprises a plurality of light source arrays connected in series to form a pillar shape.

18. A polyhedron display device comprising:
    a plurality of liquid crystal panels connected together;
    a supporting panel attached to the liquid crystal panels, the supporting panel in conjunction with the plurality of liquid crystal panel forming a polyhedral shape including an enclosed area;
    a light source housing at a center of mass of the polyhedral shape;
    one or more light sources in the light source housing at the center of mass of the polyhedral shape, each of the one or more light sources configured to emit light into and through at least two of the liquid crystal panels simultaneously; and
    a plurality of pillars between the light source housing and the plurality of liquid crystal panels,
    wherein the polyhedral shape includes a plurality of vertices, and
    wherein each of the plurality of pillars has a first end and a second end at both portions of a longitudinal direction, thereby the plurality of vertices and a surface of the light source housing are spaced apart by a length of the plurality of pillars.

19. The polyhedral display device of claim 18, wherein at least two adjacent liquid crystal panels of the plurality of liquid crystal panels are connected to each other through a panel connecting unit including a first supporting portion and a second supporting portion, wherein the first supporting portion forms an angle with the second supporting portion.

20. The polyhedral display device of claim 19, wherein each liquid crystal panel is attached to:
    a groove of the first supporting plate,
    a groove of the second supporting plate,
    an outer surface of the first supporting plate,
    an outer surface of the second supporting plate,
    an inner surface of the first supporting plate, or
    an inner surface of the second supporting plate.

21. The polyhedron display device of claim 9, wherein a plurality of connectors are connected to each of the plurality of liquid crystal panels,
    wherein a panel printed circuit is connected to the plurality of connectors, and
    wherein the plurality of connectors are bent along a plurality of concave portions at a side of each of the plurality of liquid crystal panels such that the panel printed circuit is disposed on the supporting panel.

* * * * *